United States Patent [19]

Froidevaux

[11] 4,204,162
[45] May 20, 1980

[54] METHOD OF CONTROLLING THE CONDITION OF AN ELECTRIC BATTERY AND APPARATUS FOR CARRYING OUT THIS METHOD

[75] Inventor: Jacques H. Froidevaux, La Chaux-de-Fonds, Switzerland

[73] Assignee: Electronic Time Company ETIC S.A., La Chaux-de-Fonds, Switzerland

[21] Appl. No.: 869,582

[22] Filed: Jan. 16, 1978

[30] Foreign Application Priority Data

Jan. 21, 1977 [CH] Switzerland ............................. 717/77

[51] Int. Cl.² ............................................. G01N 27/42
[52] U.S. Cl. ..................................... 324/430; 324/427
[58] Field of Search .................. 320/48; 340/248, 249; 324/29.5

[56] References Cited

U.S. PATENT DOCUMENTS

| | | | |
|---|---|---|---|
| 3,848,181 | 11/1974 | Hebert, Jr. | 324/29.5 |
| 3,899,732 | 8/1975 | Staby | 324/29.5 |

*Primary Examiner*—M. Tokar
*Attorney, Agent, or Firm*—Silverman, Cass & Singer, Ltd.

[57] ABSTRACT

A method and apparatus for determining the condition or freshness of an electric battery. The battery is discharged with a load current having an amplitude increasing linearly with time. The battery voltage is measured as the battery is discharged and the amplitude of the load current is measured when the battery voltage decreases to a predetermined value. The measured amplitude of the load current is representative of the battery condition or freshness.

7 Claims, 8 Drawing Figures

METHOD OF CONTROLLING THE CONDITION OF AN ELECTRIC BATTERY AND APPARATUS FOR CARRYING OUT THIS METHOD

The present invention relates to a method of controlling or testing the condition of an electric battery and to an apparatus or instrument for carrying out this method.

The electric batteries used for small self-powered apparatus such as pose-meters or exposure meters for photography, electronic watches, auditory protheses or hearing aids, etc., include, in most cases, a cathode containing a metallic oxide, such as silver, mercury or some other metal, and are arranged in such a way that the tension or voltage appearing at their terminals are as constant as possible during the duration of their use. Now, although this is an advantage for their use, this characteristic makes it difficult to measure their degree of freshness by a mere measuring of their voltage. The same way, their internal resistance, which varies less with their life, is also not a good criteria for measuring their freshness.

The purpose of the present invention is to furnish a simple means for measuring the degree of wear of such batteries, so as to facilitate the after sales service of the apparatuses or appliances which use them and to test that replacement batteries have not lost too much of their initial capacity during their storage.

The principle on which the invention is based makes use of the reversible chemical transformation which is produced inside of a battery when a current is drawn from the battery.

The method according to the invention is characterized by the fact that one lets the battery to be tested deliver a current increasing as a function of time and measures the value of this current at the moment when voltage drop of the battery reaches a predetermined value, the said value of the current being representative of the condition of the battery.

So far as the apparatus according to the invention for carrying out the above mentioned method is concerned, it is characterized by the fact that it includes a circuit causing the battery to deliver a current which increases linearly with time, at least one threshold detector to which the voltage of the battery is applied, a resistance mounted in series between the battery and the circuit, and an element sensitive to the voltage drop across the resistance produced by the current of the battery flowing through the resistance.

The drawing shows, by way of example, two embodiments of the object of the invention and one modification.

The notion of internal resistance is not easy to be defined for a battery, since it is, as a matter of fact, the result of several components.

Figure 1:
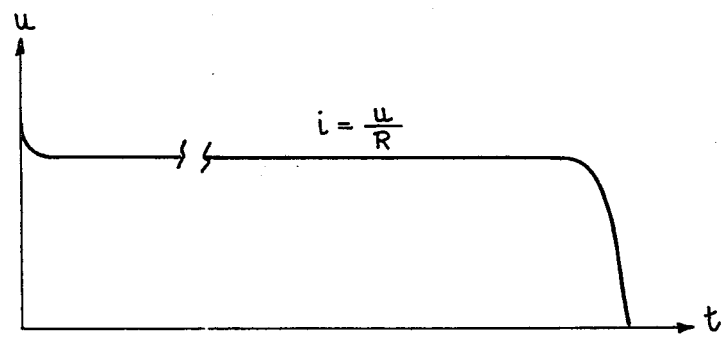
FIG. 1 is a diagram of voltage as a function of time showing the voltage of a battery during discharge.
Figures 2, 3:
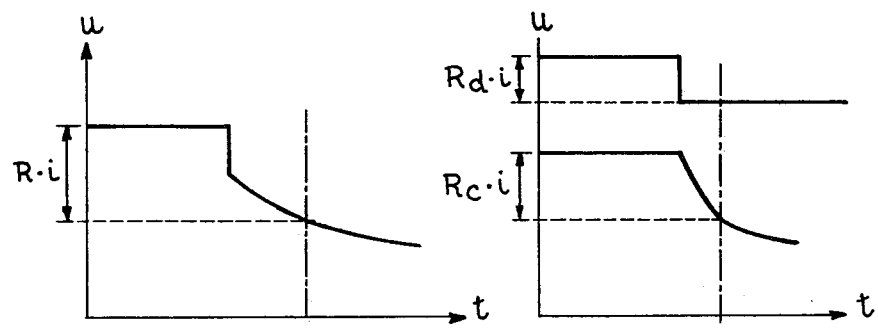
FIG. 2 is a diagram of voltage as a function of time showing the voltage drop of a battery which is beginning to deliver a current.
FIG. 3 is a diagram of voltage as a function of time showing the voltage drop representative of the internal and chemical resistances of a battery which is beginning to deliver a current.

At the moment when a battery begins to deliver a current, a first voltage drop at its terminals indicates the presence of an internal resistance which will be designated hereafter by dynamic resistance $R_d$. It is this resistance which would be measured with alternating current or without significant load current (FIG. 2).

If the current continues to be drawn, the voltage drop continues to increase according to an approximately exponential law and is established at a value which corresponds to the sum of $R_d$ and of an additional resistance hereafter designated by chemical resistance $R_c$. The latter resistance is due to chemical modifications which occur inside the battery. In so far as the current has not substantially unloaded or discharged the battery, this effect is reversible and, after the current has been cut or interrupted, the tension resumes, after a given time, its initial value.

One understands, in these conditions, that the measurement of the voltage drop for a given drain current is not a sufficient indication if the time after which the measurement must be taken has not been defined.

This is the reason why, according to the principle on which the present invention is based, one makes the battery to be tested deliver a current which increases linearly. Under these conditions, and due to the fact that $R_c$ is a function of the time, the voltage drop $\Delta U$ is established progressively, according to a function which, in the hypothesis of a purely exponential variation of $R_c$, is:

$$\Delta U = [i\, R_d + R_c(1 - e^{\frac{t}{\tau}})]$$

The variation of current being proportional to time, one has the relation:

$$i = K \cdot t$$

so that:

$$\Delta U = [K \cdot t\, R_d + R_c(1 - e^{\frac{t}{\tau}})]$$

Figure 4:
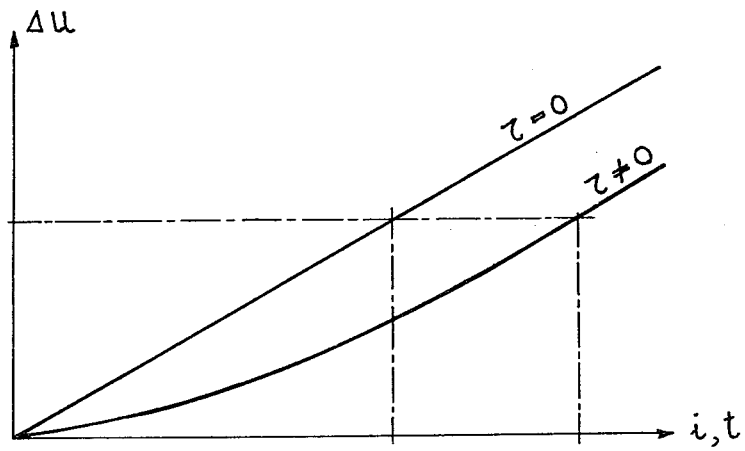
FIG. 4 is a diagram of voltage as a function of time showing the voltage drop of a battery delivering a current increasing linearly as a function of time with a zero and a non-zero time constant.

This equation is illustrated in FIG. 4 in which the upper line represents the voltage drop which would be measured for a zero time constant and, the lower curve showing the effect of a non zero time constant.

In accordance with the preceeding principals, the present principle of measurement consists in making the battery to deliver a current increasing linearly with time and measuring the current at the moment when the voltage drop reaches a predetermined value. It is this measured voltage which gives the desired indication concerning the condition of the battery. The result is therefore a function of $R_d$, of $R_c$ and of the time constant $\tau$.

The values of the allowed voltage and of the constant K will be adapted to the type of measured battery, so that the measurement gives a good approximation of the residual capacity with respect to the nominal capacity.

Figure 5:
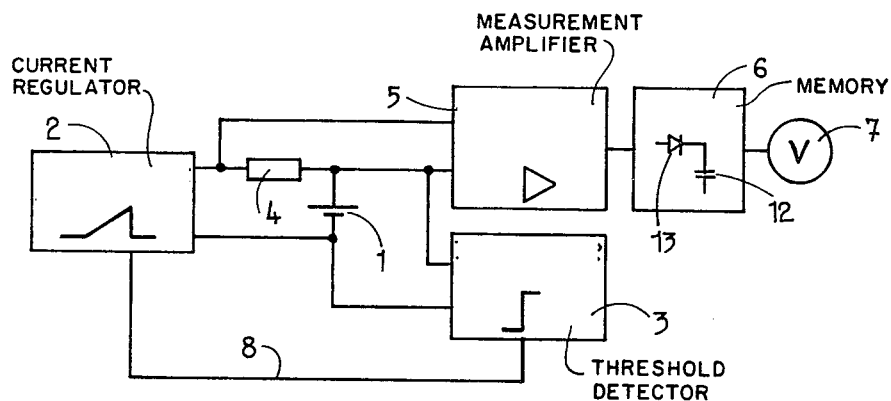
FIG. 5 represents a diagram of a first embodiment of a battery testing instrument giving the desired information analogically.

The apparatus represented in FIG. 5, intended to allow testing of the condition of an electric battery indicated at 1, includes a current regulator 2, a detector threshold 3, a resistance 4, a measurement amplifier 5, a memory 6 and a measuring instrument 7 constituted by a voltmeter.

The current regulator 2, on which is connected the battery 1, is arranged in such a way that the current delivered by the battery varies linearly with time.

The battery voltage is applied to the threshold detector 3, which is arranged in such a way as to interrupt, by a line 8 and by the regulator 2, the current delivered by the battery 1 when the voltage drop of the battery reaches a predetermined value.

The current delivered by the battery is measured by the voltage drop it produces on the resistance 4. This voltage drop is read on the voltmeter 7, its value being stored in the memory 6 which is connected to the resistance 4. The result given by the voltmeter 7 is representative of the condition of the battery 1.

Figure 6:
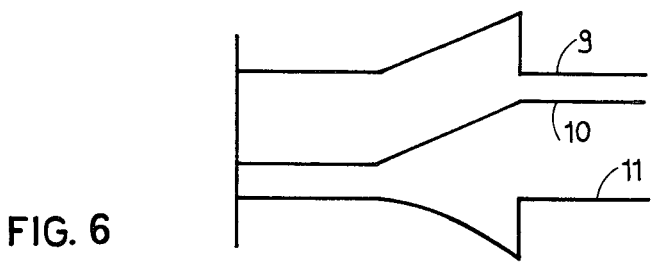
FIG. 6 is a diagram of the currents and of the voltages appearing at the outputs of the several components of the apparatus of FIG. 5.

FIG. 6 shows the shape of the current delivered by the battery (curve 9), of the voltage on the voltmeter 7 (curve 10) and of the voltage at the terminals of the battery (curve 11).

Figure 7:
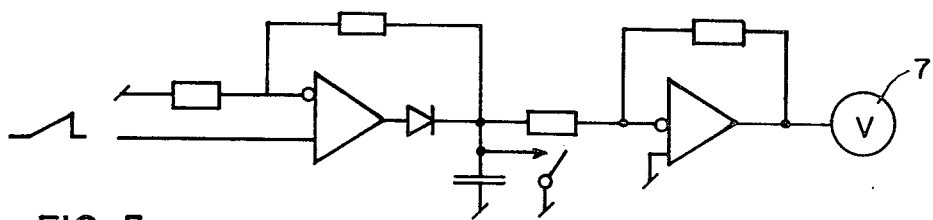
FIG. 7 represents a diagram of a modification of the memory of the apparatus of FIG. 5.

In this embodiment, the memory 6 is merely constituted by a condensor or capacitor 12 and by a diode 13. However, more complex systems, such as that of FIG. 7, for instance, can also be provided, which will have the advantage of greater precision or of longer storage.

Figure 8:
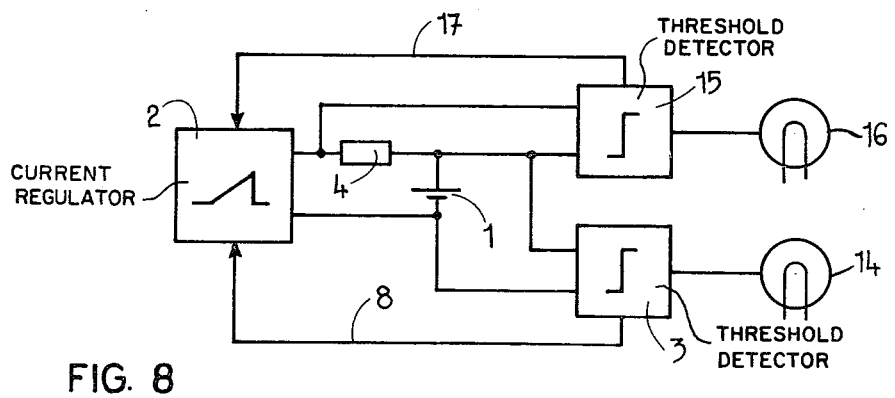
FIG. 8 represents the diagram of a second embodiment of a battery testing instrument in which the indication is merely given by pilot lamps.

In the embodiment of FIG. 8, the threshold detector 3 controls a pilot lamp 14. The amplifier 5, the memory 6 and the voltmeter 7 are suppressed and replaced by a threshold detector 15, connected to the resistance 4 and which operates a pilot lamp 16. The threshold detector 15 is arranged to interrupt the current by a line 17 and the regulator 2.

This arrangement constitutes a dual threshold detector that switches as soon as the current delivered by the battery reaches a predetermined value which lights the lamp 16. So far as the lamp 14 is concerned, it lights when the voltage drop of the battery reaches its predetermined value.

Consequently, the two following situations can occur.

1. At the end of the measurement, the lamp 14 is lighted. This means that the voltage has dropped to the predetermined value before the current has reached the level required for a good battery. Consequently, the battery is rejected.

2. At the end of the measure, the lamp 16 is lighted: This means that the current has reached the predetermined value without having produced too great a voltage drop. Consequently, the battery is considered good.

It is to be noted that one selects the slope of current controlled by the regulator 2 as well as the predetermined values of the voltage drop and of the current, determined by the threshold detectors 3 and 15, respectively, according to the characteristics of the batteries to be tested.

Consequently, the apparatus according to the first embodiment (FIG. 5) includes a measuring instrument, the voltmeter 7 of which can be calibrated in percentage of residual capacity, while the apparatus according to the second embodiment (FIG. 8) is less complex but more convenient for the after sales service or in order to check that the batteries have not been stored for too long a time.

What I claim is:

1. A method of determining the freshness of an electric battery, said method comprising:
   discharging the battery with a load current having an amplitude increasing linearly as a function of time,
   measuring the value of the voltage of said battery as said battery is discharged, and
   measuring the amplitude of said load current when said value of said battery voltage decreases to a predetermined value, said measured load current amplitude being representative of said battery freshness.

2. A method as claimed in claim 1, further including:
   storing a signal representative of said amplitude of said load current when said value of said battery voltage equals said predetermined value, and
   displaying said stored signal on a measurement instrument.

3. A method as claimed in claim 1 further including:
   activating one of a first and second indicator,
   activating said first indicator to indicate a fresh battery when said load current amplitude increases to a predetermined amplitude,
   activating said second indicator to indicate a rejected battery when said value of said battery voltage decreases to said predetermined value, and
   interrupting said discharging of the battery when one of said first and second indicators is activated.

4. An apparatus for determining the freshness of an electric battery, said apparatus comprising:
   electronic means coupled to the battery for discharging said battery with a load current having an amplitude increasing linearly as a function of time,
   first measurement means coupled to said battery for measuring the value of the voltage of said battery as said battery is discharged, and
   second measurement means coupled to said battery for measuring the amplitude of said load current when said value of said battery voltage decreases to a predetermined value, said measured load current amplitude being representative of said battery freshness.

5. An apparatus as claimed in claim 4 which further includes a resistance connected in series between said battery and said electronic means through which flows said load current, and in which said second measurement means are coupled across said resistance for measuring the amplitude of said load current by measuring the voltage across said resistance produced by said load current flowing through said resistance.

6. An apparatus as claimed in claim 5 in which said second measurement means include:
   amplifier means coupled to said resistance means for producing a signal representative of said voltage value produced across said resistance means by said load current flowing through said resistance,
   memory means coupled to said amplifier means for storing said signal, and
   voltmeter means coupled to said memory means for measuring said stored signal.

7. An apparatus as claimed in claim 4 in which said first measurement means include first threshold detector means coupled to said electronic means for interrupting said discharging of said battery when said load current amplitude increases to a predetermined amplitude, said first threshold detector including first indicator means for producing an indication of a fresh battery when said load current amplitude equals said predetermined amplitude, and in which said second measurement means include second threshold detector means coupled to said electronic means for interrupting said discharging of said battery when said value of said battery voltage decreases to said predetermined value, said second threshold detector including second indicator means for producing an indication of a rejected battery when said value of said battery voltage decreases to said predetermined value.

* * * * *